(12) United States Patent
Ferraiolo et al.

(10) Patent No.: US 7,646,208 B2
(45) Date of Patent: Jan. 12, 2010

(54) ON-CHIP DETECTION OF POWER SUPPLY VULNERABILITIES

(75) Inventors: Frank D. Ferraiolo, New Windsor, NY (US); Anuja Sehgal, Durham, NC (US); Peilin Song, Lagrangeville, NY (US); Michael A. Sperling, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 12/013,833

(22) Filed: Jan. 14, 2008

(65) Prior Publication Data

US 2008/0129325 A1 Jun. 5, 2008

Related U.S. Application Data

(63) Continuation of application No. 11/056,822, filed on Feb. 10, 2005, now Pat. No. 7,355,435.

(51) Int. Cl.
*G01R 31/36* (2006.01)
*G01R 31/28* (2006.01)
*H01L 23/58* (2006.01)

(52) U.S. Cl. .......................... 324/771; 257/48; 324/763
(58) Field of Classification Search ......... 324/754–771, 324/158.1; 257/48; 714/733, 734; 713/340; 340/635
See application file for complete search history.

(56) References Cited

U.S. PATENT DOCUMENTS

| 5,053,640 | A | 10/1991 | Yum ....................... 307/296.6 |
| 5,180,932 | A | 1/1993 | Bengel ....................... 307/353 |
| 5,374,860 | A | 12/1994 | Llewellyn ................... 327/276 |
| 5,598,114 | A | 1/1997 | Jamshidi .................... 326/113 |
| 5,625,303 | A | 4/1997 | Jamshidi .................... 326/106 |
| 5,646,558 | A | 7/1997 | Jamshidi .................... 326/106 |
| 5,670,904 | A | 9/1997 | Moloney et al. ............ 327/277 |
| 5,701,095 | A | 12/1997 | Ohsawa ...................... 327/410 |
| 5,773,995 | A | 6/1998 | Crocker ...................... 326/108 |
| 5,939,933 | A | 8/1999 | Wang |
| 5,966,005 | A | 10/1999 | Fujimori |
| 6,014,050 | A | 1/2000 | McClure ..................... 327/281 |
| 6,044,027 | A | 3/2000 | Zheng et al. ................ 365/194 |

(Continued)

OTHER PUBLICATIONS

H. Aoki, M. Ikeda, K. Asada, "On-Chip Voltage Noise Monitor For Measuring Voltage Bounce In Power Supply Lines Using A Digital Tester", Proceedings of the 2000 International Conference on Microelectronic Test Structures, 2000, pp. 112-117.

(Continued)

*Primary Examiner*—Ernest F Karlsen
(74) *Attorney, Agent, or Firm*—William A. Kinnaman, Jr., Esq.; Blanche E. Schiller, Esq.; Heslin Rothenberg Farley & Mesiti P.C.

(57) ABSTRACT

On-chip sensor to detect power supply vulnerabilities. The on-chip sensor employs a sensitive delay chain and an insensitive delay chain to detect power supply undershoots and overshoots without requiring external off-chip components. Undershoots and overshoots outside a user-defined threshold are detected. The undershoots and overshoots are indicated by a relative difference in phase of the two delay chains. The two delay chains are programmable to detect various frequencies.

11 Claims, 7 Drawing Sheets

U.S. PATENT DOCUMENTS

| | | | | |
|---|---|---|---|---|
| 6,163,195 | A | 12/2000 | Jefferson | 327/262 |
| 6,211,659 | B1 | 4/2001 | Singh | |
| 6,255,879 | B1 | 7/2001 | Voss | 327/276 |
| 6,262,616 | B1 | 7/2001 | Srinivasan | 327/264 |
| 6,285,229 | B1 | 9/2001 | Chu et al. | 327/277 |
| 6,404,258 | B2 | 6/2002 | Ooishi | 327/278 |
| 6,411,149 | B1 | 6/2002 | Ooishi | 327/281 |
| 6,421,784 | B1 | 7/2002 | Chu et al. | 713/401 |
| 6,462,582 | B1 | 10/2002 | Forbes | 326/98 |
| 6,501,324 | B2 | 12/2002 | Ruegg et al. | 327/408 |
| 6,529,058 | B2 | 3/2003 | Gupta | 327/276 |
| 6,546,530 | B1 | 4/2003 | Dreps et al. | 716/6 |
| 6,611,936 | B2 | 8/2003 | Jue et al. | 714/741 |
| 6,646,464 | B2 | 11/2003 | Maruyama | 326/35 |
| 6,646,488 | B2 | 11/2003 | Ajit | 327/262 |
| 6,708,238 | B1 | 3/2004 | Rotker | 710/58 |
| 6,708,285 | B2 | 3/2004 | Oldfield | 714/6 |
| 6,747,470 | B2 | 6/2004 | Muhtaroglu et al. | 324/765 |
| 6,842,027 | B2 | 1/2005 | Liu | 324/763 |
| 6,882,211 | B2 | 4/2005 | Kozaki | 327/407 |
| 6,882,238 | B2 | 4/2005 | Kurd et al. | 331/186 |
| 6,933,729 | B2 * | 8/2005 | Corr | 324/537 |
| 7,116,114 | B2 * | 10/2006 | Kajita | 324/613 |
| 7,157,924 | B2 * | 1/2007 | Muhtaroglu et al. | 324/765 |
| 7,242,242 | B2 | 7/2007 | Bedarida et al. | |
| 7,355,429 | B2 * | 4/2008 | Jenkins et al. | 324/763 |
| 2002/0093370 | A1 | 7/2002 | Park et al. | |
| 2004/0178452 | A1 | 9/2004 | Miyasaka | 257/350 |

OTHER PUBLICATIONS

A. Muhtaroglu, G. Taylor, T. Rahal-Arabi, "On-Die Droop Detector For Analog Sensing Of Power Supply Noise", IEEE Journal of Solid-State Circuits, vol. 39, Issue 4, Apr. 2004, pp. 651-660.

* cited by examiner

ON-CHIP DETECTION OF POWER SUPPLY VULNERABILITIES

CROSS-REFERENCE TO RELATED APPLICATIONS

This application is a continuation of co-pending U.S. patent application Ser. No. 11/056,822, filed Feb. 10, 2005, entitled "ON-CHIP DETECTION OF POWER SUPPLY VULNERABILITIES," the entirety of which is hereby incorporated herein by reference.

This application also contains subject matter which is related to the subject matter of the following applications, each of which is assigned to the same assignee as this application and hereby incorporated herein by reference in its entirety:

"Power Supply Insensitive Delay Element," Dreps et al., U.S. Ser. No. 11/056,798, filed Feb. 10, 2005; and "Power Supply Noise Insensitive Multiplexer," Sperling et al., U.S. Pat. No. 7,212,062, issued May 1, 2007.

TECHNICAL FIELD

This invention relates, in general, to detecting vulnerabilities of a voltage power supply, and in particular, to providing an on-chip detection capability that facilitates detection of power supply vulnerabilities.

BACKGROUND OF THE INVENTION

To maximize performance of computer systems and computer chips, it is important to monitor and detect vulnerabilities (e.g., noise) in the one or more voltage power supplies within the systems or on the chips. Currently, there are a number of techniques used to detect power supply noise.

One technique for detecting power supply noise is described in a paper entitled "On-Chip Voltage Noise Monitor For Measuring Voltage Bounce In Power Supply Lines Using A Digital Tester," H. Aoki, M. Ikeda, K. Asada, Proceedings of the 2000 International Conference on Microelectronic Test Structures, 2000, pp. 112-117, which is hereby incorporated herein by reference in its entirety. This paper describes a technique that employs a comparator that compares the noisy supply to a reference voltage. The comparator requires four clocks, and the performance of the comparator strongly depends on the time constant of the capacitors in the design. The capacitors have to be sized such that the drain-to-gate capacitance of the transistors does not corrupt the measured data. Hence, this technique is extremely sensitive to sizing and does not have any calibration features.

A further technique is described in a paper entitled "On-Die Droop Detector For Analog Sensing Of Power Supply Noise," A. Muhtaroglu, G. Taylor, T. Rahal-Arabi, IEEE Journal of Solid-State Circuits, Vol. 39, Issue 4, April 2004, pp. 651-660, which is hereby incorporated herein by reference in its entirety. This paper uses a very complicated calibration procedure that requires two 32-bit digital-to-analog converters (DACs) to generate current references. Also, each sensor requires a dedicated current reference, since the calibration features are a function of the current reference (two 32-bit DACs). Further, this approach requires two separate sensors to detect overshoots and undershoots. It also requires two current references to set different thresholds for overshoots and undershoots. Thus, this technique has a high area overhead.

Based on the foregoing, a need still exists for an enhanced capability to detect power supply noise and other power supply vulnerabilities. For example, a need exists for a non-invasive on-chip detection capability. As a further example, a need exists for an on-chip detection capability that does not employ external components in its detecting.

SUMMARY OF THE INVENTION

The shortcomings of the prior art are overcome and additional advantages are provided through the provision of a sensing circuit. The circuit includes, for instance, an on-chip sensor to detect vulnerability in a power supply of a chip including the on-chip sensor, the on-chip sensor detecting the vulnerability absent components external to the chip.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

In accordance with an aspect of the present invention, an on-chip Vdd sensor detects vulnerabilities (e.g., overshoots and undershoots) of a power supply voltage compared to a user defined threshold. The sensor includes two delay chains, one insensitive and the other sensitive to voltage variations. The relative difference in the phase of the two delay chains indicates the occurrence of an overshoot or undershoot of the voltage supply being monitored.

Figure 1:
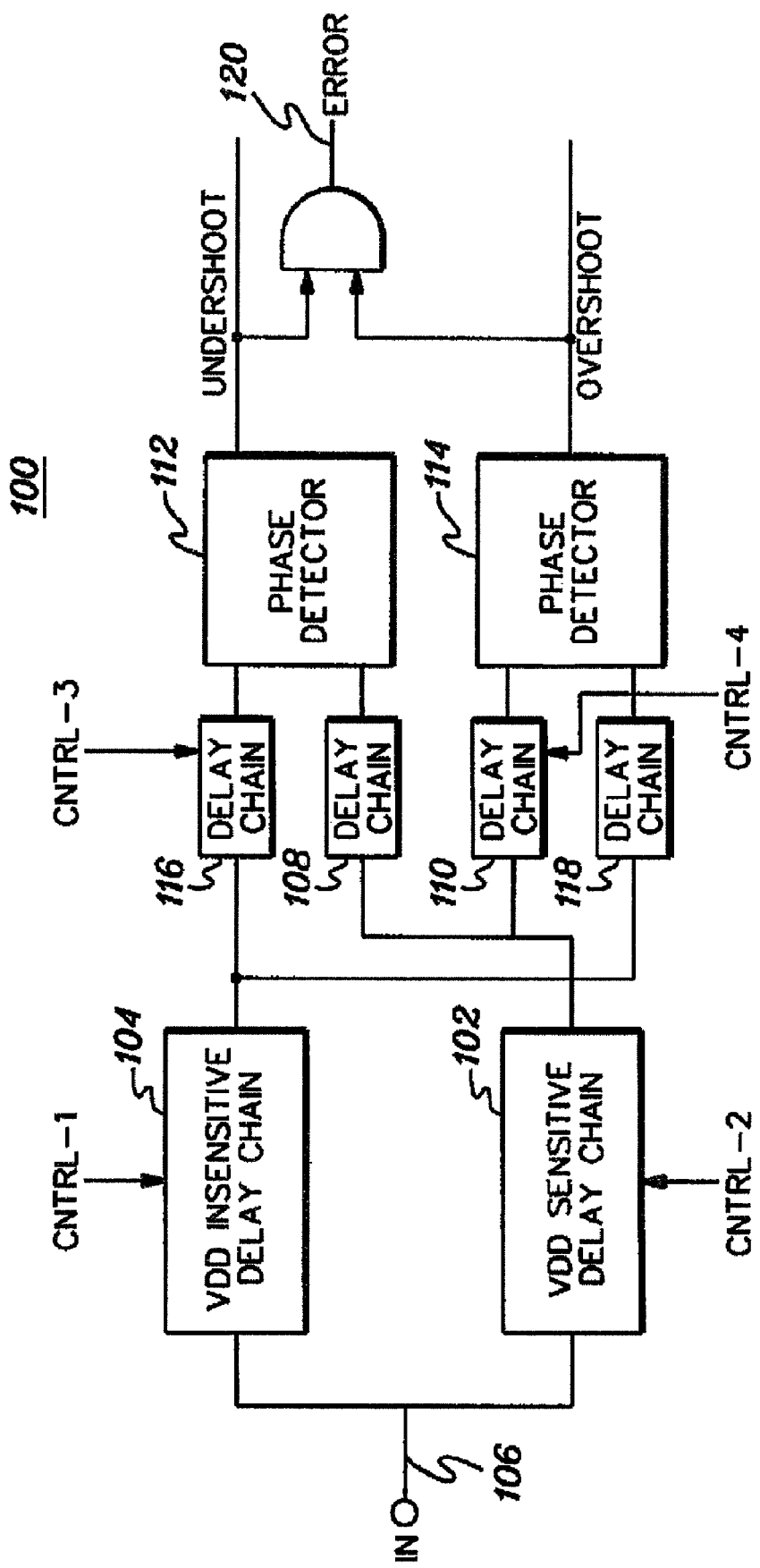
FIG. 1 depicts one embodiment of an on-chip Vdd sensor, in accordance with an aspect of the present invention.

One example of an on-chip Vdd sensor is described with reference to FIG. 1. In one example, an on-chip Vdd sensor 100 includes a sensitive delay chain 102 and an insensitive delay chain 104, each of which receives as input a signal 106, such as a clock signal, data signal or other digital signal. The output of sensitive delay chain 102 is a delayed signal, which is input to additional delay chains 108 and 110, which further delay the signal. The output of delay chain 108 is input to a phase detector 112 and the output of delay chain 110 is input to a phase detector 114. The phase detectors are used to determine if there is an undershoot or overshoot, as described below.

Similarly, the output of insensitive delay chain 104 is a delayed signal that is input to additional delay chains 116 and 118, which further delay the signal. The output of delay chain 116 is input to phase detector 112 and the output of delay chain 118 is input to phase detector 114. In this example, the phase detectors are balanced with the addition of mimic delay elements 108, 118, respectively. Additional details regarding the components of the on-chip sensor are described in further detail below.

Figure 2A:
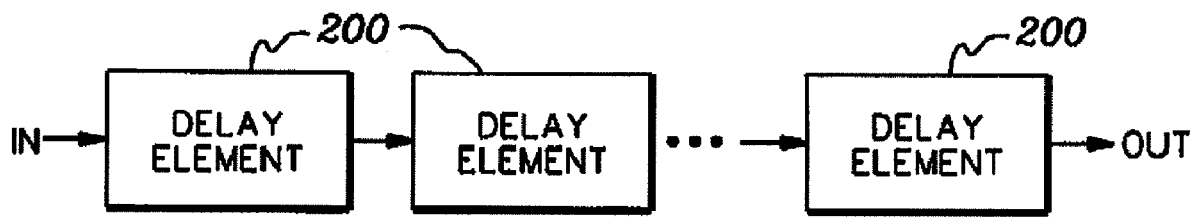
FIG. 2a depicts one example of a sensitive delay chain of the on-chip sensor of FIG. 1, in accordance with an aspect of the present invention.

Sensitive delay chain 102 includes a plurality of delay elements 200 (FIG. 2a) coupled to one another to form the delay chain. The number of delay elements included in the chain is dependent on the amount of desired delay. As examples, the delay chain includes 32 or 64 delay elements or any other number that provides the desired delay. Each delay element is used to provide delay and the delay elements of this delay chain are sensitive to power supply noise and other vulnerabilities. One example of a power supply sensitive delay element is described in further detail with reference to FIG. 2b.

Figure 2B:
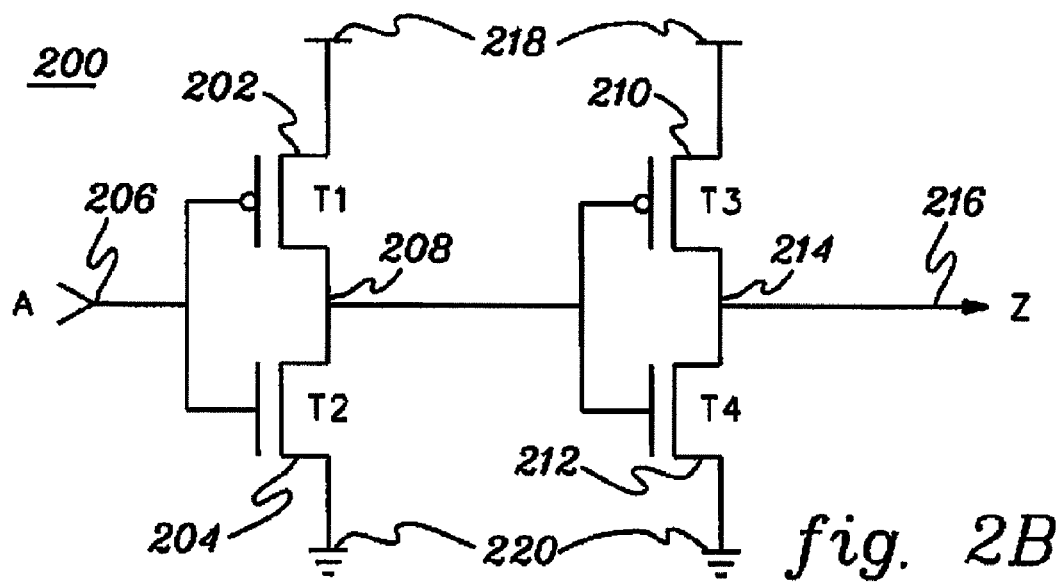
FIG. 2b depicts one example of a delay element of the delay chain of FIG. 2a that is sensitive to power supply vulnerabilities, in accordance with an aspect of the present invention.

As shown in FIG. 2b, a delay element 200 includes a double inverter structure in which a transistor 202 (T1) and a transistor 204 (T2) are gated by an input signal 206 (A). Transistors 202 and 204 have commonly connected drains 208, which gate a second set of transistors 210 (T3) and 212 (T4). The drains of those transistors are also commonly connected (214) and provide the output at 216 (Z).

In this example, transistors T1 and T3 are PFET transistors tied to a power supply (Vdd) 218 of the delay element, and transistors T2 and T4 are NFET transistors tied to ground 220.

The delay is determined by the amount of current through the transistors and the capacitive load at their output. The load that the transistors see is constant, since it is a parasitic gate capacitance. The current through the transistors is varied by any supply voltage (Vdd) variation, since it is proportional to gate-to-source voltage. This delay element is thus sensitive to vulnerabilities of the power supply of the delay element.

Returning to FIG. 1, as shown, in this example, sensitive delay chain 102 is controllable by a control, referred to as CNTRL-2. This control enables the delay chain to produce a variable amount of delay. For instance, more delay may be chosen by selecting additional delay elements of the chain, and less delay may be chosen by selecting fewer delay elements.

Figure 2C:
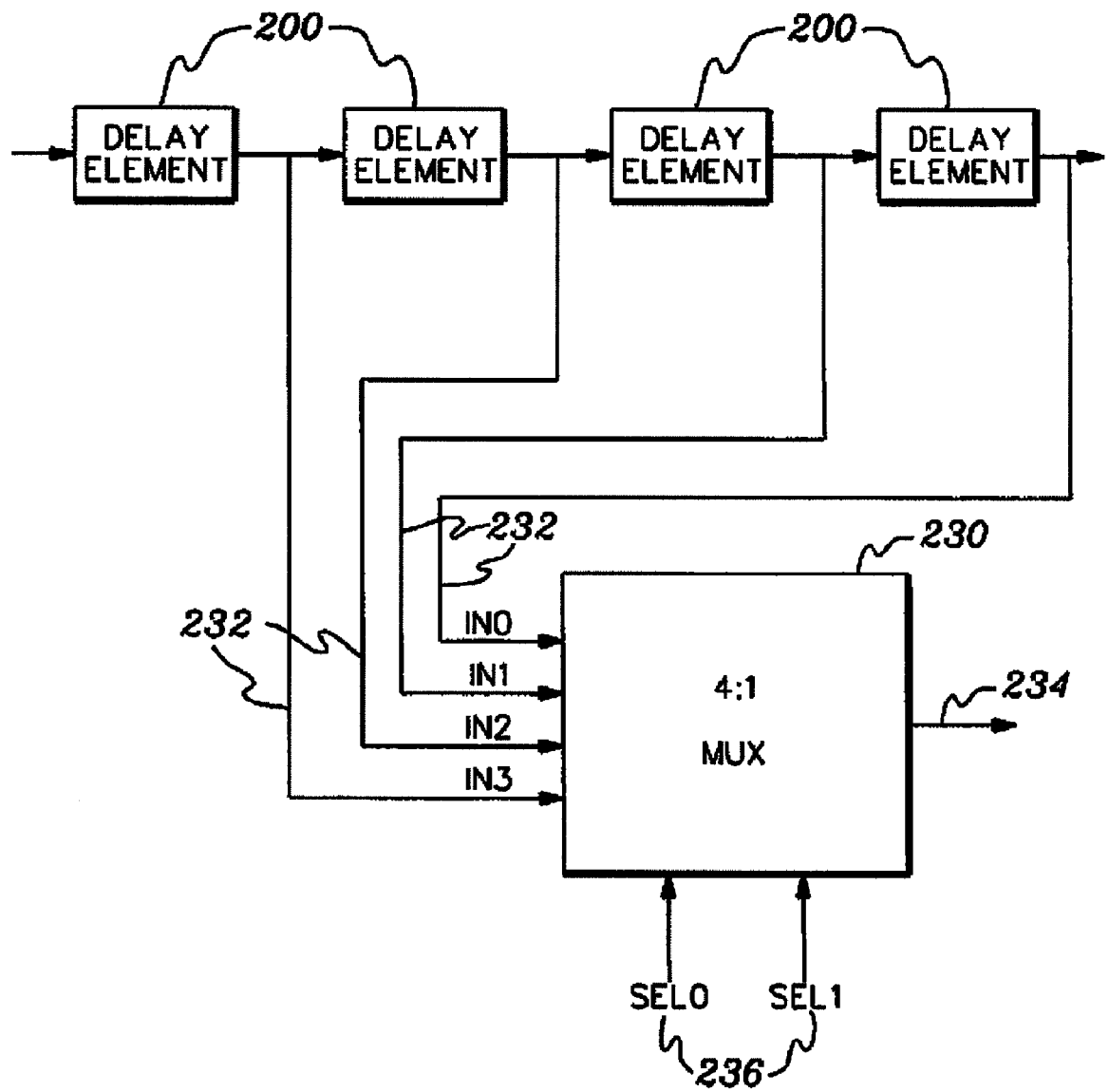
FIG. 2c depicts one example of a control used to manage an amount of delay through the delay chain of FIG. 2a, in accordance with an aspect of the present invention.

The selecting of the desired number of delay elements is provided via one or more multiplexors (MUXs) coupled to the outputs of the delay elements. For instance, as depicted in FIG. 2c, a multiplexor 230 receives as inputs 232 the output of a plurality of delay elements 200 and produces an output 234 via one or more selects 236. In this example, multiplexor 230 is a 4:1 mux receiving four inputs and producing one output. However, in other examples, other size multiplexors may be used without departing from the spirit of the present invention. Moreover, other types of multiplexors may be used. As one example, a multiplexor insensitive to power supply vulnerabilities may be used. One embodiment of such a multiplexor is described in "Power Supply Noise Insensitive Multiplexer," Sperling et al., U.S. Pat. No. 7,212,062, issued May 1, 2007 which is hereby incorporated herein by reference in its entirety. The output of the multiplexor may be input to another multiplexor, if there are more delay elements to be multiplexed, or input to delay chains 108 (FIG. 1), 110, if further selection is not desired.

Figure 3A:
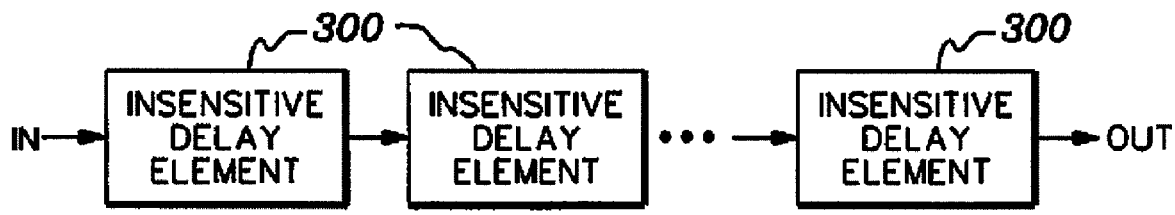
FIG. 3a depicts one example of an insensitive delay chain of the on-chip sensor of FIG. 1, in accordance with an aspect of the present invention.
Figure 3B:
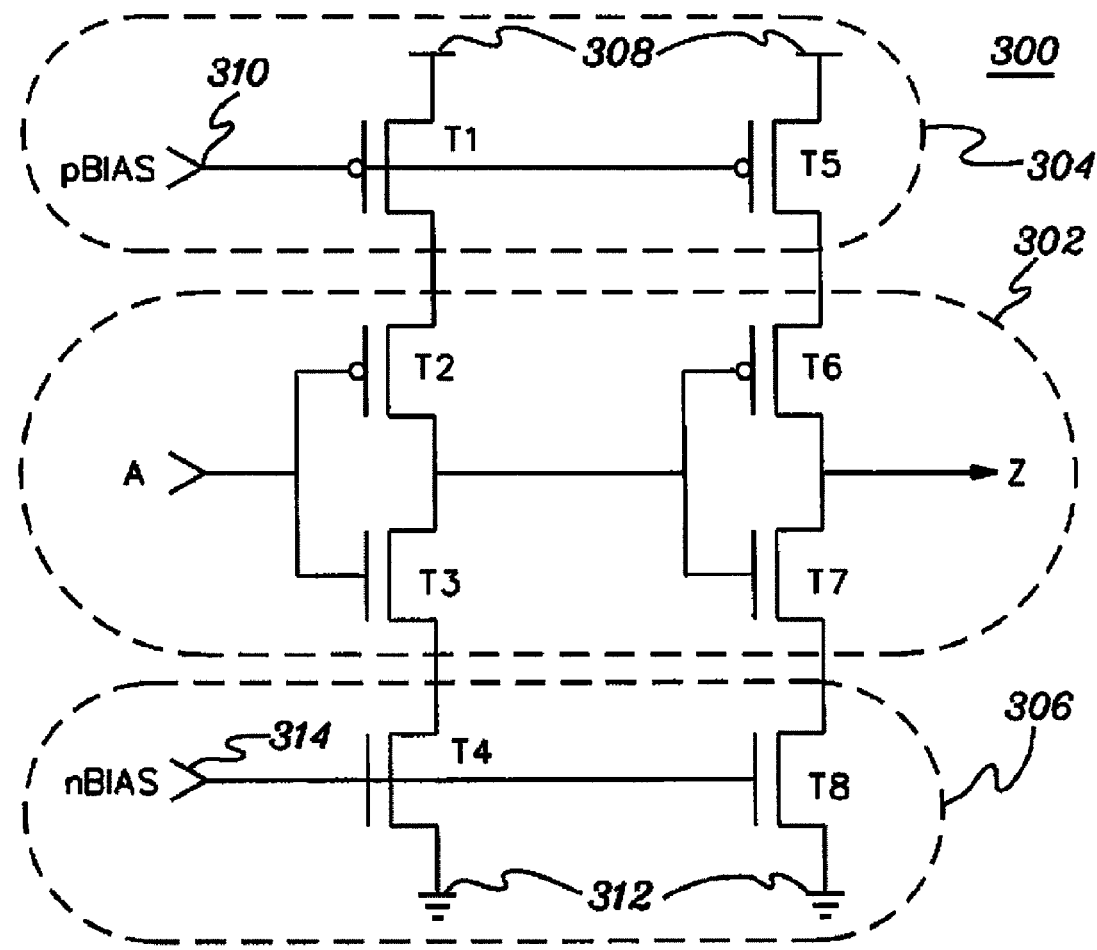
FIG. 3b depicts one example of a delay element of the delay chain of FIG. 3a that is insensitive to power supply vulnerabilities, in accordance with an aspect of the present invention.

Similar to sensitive delay chain 102, insensitive delay chain 104 (FIG. 1) also includes a plurality of delay elements 300 (FIG. 3a) (e.g., 32, 64, or any other value that provides the desired delay). However, the delay elements of this delay chain are insensitive to vulnerabilities in the power supply. These vulnerabilities include noise and/or other external factors that cause unwanted voltage fluctuations, as examples. The delay elements are insensitive in that the delay varies proportionally less than the power supply fluctuations. One embodiment of an insensitive delay element is described below with reference to FIG. 3b.

An insensitive delay element 300 includes, for instance, a double inverter structure 302, similar to the inverter structure described with reference to FIG. 2b, as well as a header structure 304 and a footer structure 306 coupled thereto. For instance, the sources of transistors T2 and T6 of inverter structure 302 are connected to the drains of transistors T1 and T5, respectively, of header structure 304. Similarly, the sources of transistors T3 and T7 of inverter structure 302 are connected to the drains of transistors T4 and T8, respectively, of footer structure 306.

Transistors T1 and T5 are tied to a power supply (Vdd) 308, and they are gated by an input 310, referred to as pBIAS, as described below. Further, transistors T4 and T8 are tied to ground 312 and are gated by an input 314, referred to as nBIAS, which is also described below. In this example, the transistors of header structure 304 are PFET transistors and the transistors of footer structure 306 are NFET transistors. However, in other examples, the type of transistors in either structure or in the inverter structure may be different than that shown here.

Delay element 300 has a characteristic of producing constant delay (i.e., delay with little or no variation; e.g., +/− about 1% of variation) within a range of voltage variation (e.g., +/−15% of variation). This is possible by limiting the current through the transistors using the pBIAS and nBIAS voltages. Since PFET transistors T1 and T5's gate-to-source voltage is held constant by the pBIAS input voltage, the current through T1 and T5 is held constant against unwanted Vdd fluctuations. The same is true with NFET transistors T4 and T8 where the gate voltage is provided by the nBIAS input voltage.

Figure 4:
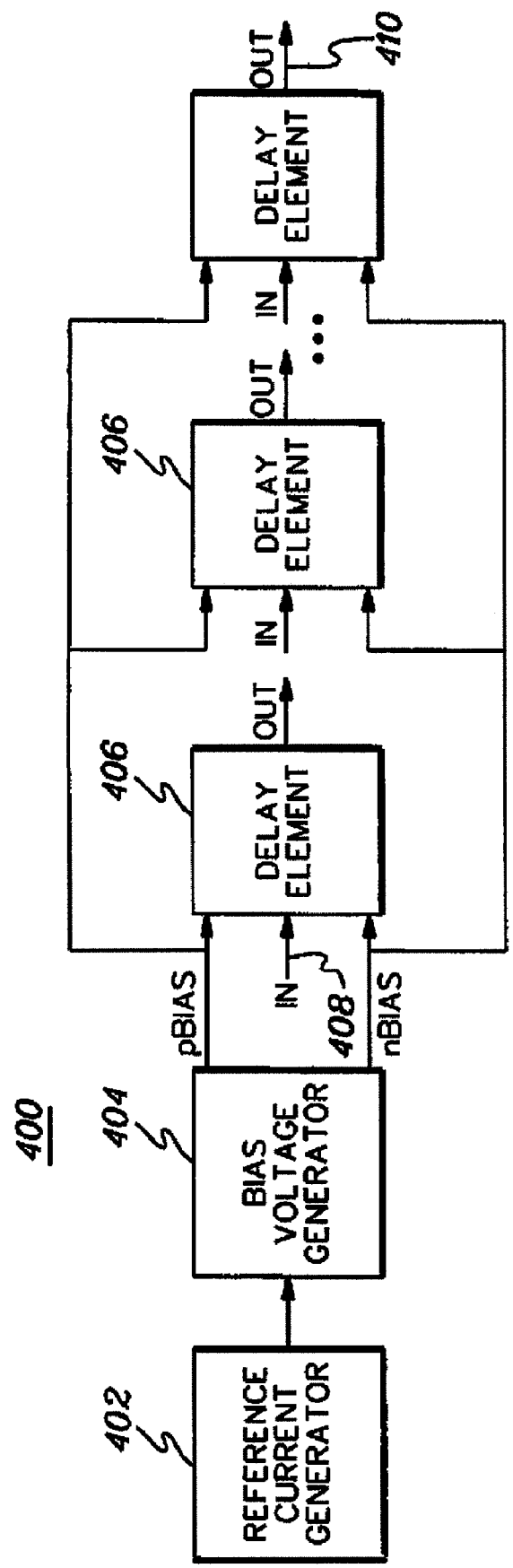
FIG. 4 depicts one embodiment of a delay line that includes one or more delay elements of FIG. 3b, in accordance with an aspect of the present invention.

The inputs, pBIAS and nBIAS, of delay element 300 are provided by a bias voltage generator, which is coupled to the delay elements, as depicted in FIG. 4. Specifically, in this embodiment, the delay elements and the bias voltage generator are components of a delay line 400 used to facilitate the providing of power supply insensitive delay.

As one example, delay line 400 includes, for instance, a reference current generator 402 coupled to a bias voltage generator 404 which is further coupled to one or more delay elements 406. Reference current generator 402 generates a constant amount of current regardless of the power supply voltage variation (i.e., regardless of unwanted variation within a range due to power supply vulnerabilities). This reference current is used by the bias voltage generator to generate reference voltages for the delay elements. The delay element's delay is determined by the amount of current generated by the reference current generator, which shows constant current against voltage variation. Thus, the delay element has an enhanced power supply insensitivity compared with conventional delay elements.

Reference current generator 402 is a conventional circuit, such as a bandgap reference circuit or a resistor based circuit, which is used to provide a constant (e.g., little or no change) current reference. The bandgap based reference current generator provides a constant current against any power supply voltage and temperature variations. One example of a bandgap reference circuit is described in U.S. Pat. No. 5,053,640, entitled "Bandgap Voltage Reference Circuit," Yum, issued Oct. 1, 1991, which is hereby incorporated herein by reference in its entirety.

The output of the reference current generator is input to bias voltage generator 404, which uses the reference current from the reference current generator to generate pBIAS and nBIAS voltages that are used to set the delay in the delay elements. One function of this circuit is to form a constant voltage from Vdd-to-pBIAS and nBIAS-to-ground (GND). This is accomplished by mirroring the reference current generator input current to a second branch, as described with reference to FIG. 5.

Figure 5:
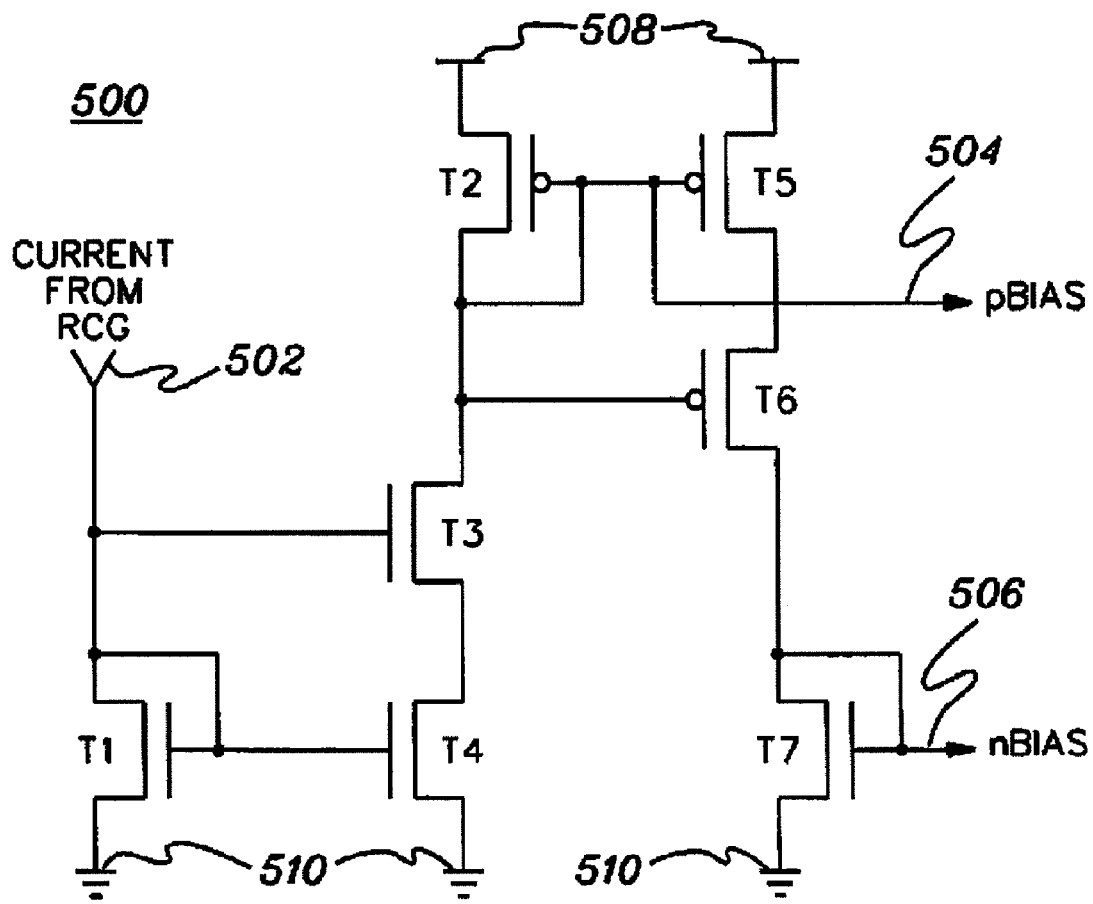
FIG. 5 depicts further details of a bias voltage generator of the delay line of FIG. 4, in accordance with an aspect of the present invention.

FIG. 5 depicts one example of a bias voltage generator 500. Input to bias voltage generator 500 is current from the reference current generator as indicated at 502. There are two outputs, pBIAS 504 and nBIAS 506. The current input is gated to transistors T1, T3 and T4. Mirroring is provided from T1 to T4 and a cascode is added by the provision of transistor T3. Transistor T3 is coupled in series with transistors T2 and T4. Further, a mirror is provided from transistor T2 to T5, which are tied to a power supply 508. A cascode is added by the inclusion of transistor T6. Transistors T2, T5 and T6 are gated to the same source. Transistors T5 and T6 are coupled in series with transistor T7. The gate voltages of T6 and T7 provide a pBIAS output voltage 504 and nBIAS output voltage 506, respectively. Transistors, T1, T4 and T7 are tied to ground 510.

In this particular embodiment, transistors T3 and T6 have a low voltage threshold (VT), i.e., a voltage threshold lower than that of T4 and T5, respectively (e.g., approximately, 30% lower). By using low VT transistors, cascoding is provided without the need for additional bias voltage, since the gate voltage of T3 and T4 is shared. By cascoding these two lines, there is higher impedance looking at the output of the two current mirrors. This higher impedance gives better current matching in a current mirror.

Referring back to FIG. 4, the outputs of the bias voltage generator, pBIAS and nBIAS, are input to each of delay elements 406. One example of delay element 406 is described with reference to FIG. 3b. The pBIAS and nBIAS voltages are used to provide a delay that is insensitive to power supply voltage vulnerabilities. A signal, such as a clock, data or other digital signal, is input at 408 and a delayed signal is output at 410. The delay provided through the delay elements is relatively insensitive to power supply noise and other vulnerabilities (e.g., the delay does not change within +/−15% of voltage variation).

Returning to FIG. 1, as with sensitive delay chain 102, insensitive delay chain 104 is also programmable. That is, in this embodiment, the delay through delay chain 104 is controllable via CNTRL-1. CNTRL-1 includes, as one example, one or more multiplexors coupled to the output of the delay elements of the delay chain, similar to that described with reference to FIG. 2c. The multiplexors used to control the delay in insensitive delay chain 104 are the same type of multiplexors as those used to control the delay through delay chain 102. However, in another embodiment, the multiplexors for one delay chain may be different than the multiplexors for another delay chain. Moreover, the number of multiplexors for one delay chain may be the same or different than the number used for another delay chain.

The outputs of sensitive delay chain 102 and insensitive delay chain 104 are input to a plurality of additional delay chains to further delay the signal. In particular, the output of sensitive delay chain 102 is input to a delay chain 108 and a programmable delay chain 110. Further, the output of insensitive delay chain 104 is input to a programmable delay chain 116 and a delay chain 118. In this example, each delay chain is an insensitive delay chain that includes a plurality of delay elements (e.g., 4-10). However, in other embodiments, one or more of the delay chains may be sensitive chains, and more or less delay elements may be included in each chain. Each delay chain 108, 110, 116, 118 may have the same number of delay elements, a different number of delay elements, or any combination thereof. Similarly, delay chain 102 and delay chain 104 may have the same number of delay elements or a different number of delay elements. Yet further, a particular delay chain may include a mix of insensitive and sensitive delay elements.

Delay chains 116 and 110 are programmable in this embodiment. That is, more or less delay may be provided in each chain depending on a user-defined threshold. For instance, if the user-defined threshold indicates that fluctuations exceeding a particular value (e.g., 10%) are to be detected, then the delay is controlled such that those fluctuations are detected. Each of these controls is, for example, one or more multiplexors, as described with reference to CNTRLs-1 and 2.

The output of additional delay chains 116 and 108 are input to a phase detector 112, and the output of additional delay chains 110 and 118 are input to a phase detector 114. The phase detectors are employed to compare the relative difference in phase between delay chains 102 and 104. Each of phase detectors 112, 114 is, for instance, an edge triggered D-type flip flop in which one of the delay chains drives the D-input and the other drives the clock input. For example, the output of delay chain 116 drives the D-input of phase detector 112 and the output of delay chain 108 drives the clock input of phase detector 112. Similarly, the output of delay chain 110 drives the D-input of phase detector 114 and the output of delay chain 118 drives the clock input of phase detector 114.

The output of phase detector 112 specifies an undershoot, if the output of the phase detector is high (e.g., binary 1) indicating that the output of delay chain 116 reached phase detector 112 prior to the output of delay chain 108 clocking the phase detector. Likewise, the output of phase detector 114 specifies an overshoot, if the output of the phase detector is high, indicating that the output of delay chain 110 reached phase detector 114 prior to the output of delay chain 118 clocking the phase detector. Should the output of both phase detectors be high at the same time, then an error 120 is indicated.

Figure 6:
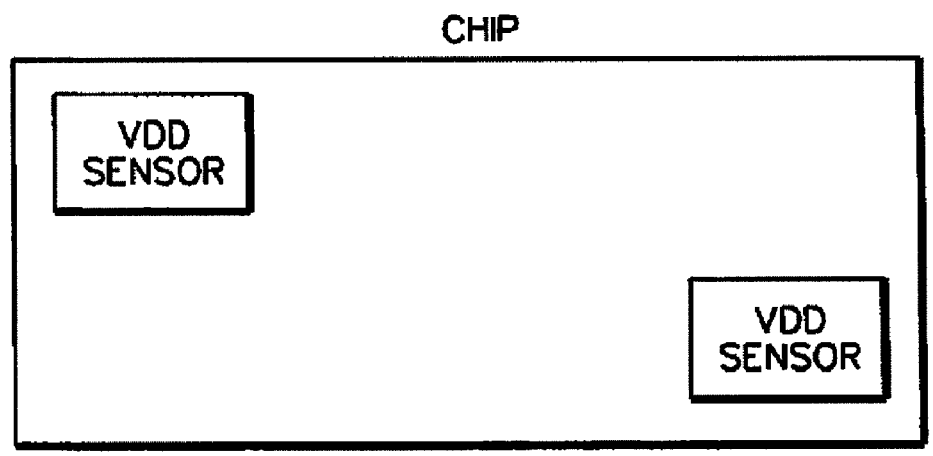
FIG. 6 depicts one example of a chip having a plurality of sensors incorporated therein, in accordance with an aspect of the present invention.

Described above is an on-chip sensor that detects voltage supply vulnerabilities. The sensor is programmable in various ways enabling different frequencies to be monitored. The on-chip sensor is included in one or more places on a chip, as depicted in FIG. 6. The on-chip sensor is simple and flexible, and thus, is able to be included in as many locations as desired to monitor voltage supplies and detect vulnerabilities in those supplies. The sensor detects the vulnerabilities without using external off-chip components, such as clocks and/or external pins.

The sensor includes, for instance, two delay chains: one that is designed from common logic that is typically found on the chip (i.e., the sensitive delay chain), and one that is designed out of voltage insensitive circuitry (i.e., the insensitive delay chain). The relative difference in phase between those two chains indicates the occurrence of an overshoot or undershoot of the Vdd supply. The Vdd variations are used to modulate the delay of the sensitive delay chain. Phase detectors are used to detect the difference in the phase of the two delay chains. In the event of an overshoot, the delay of the sensitive delay chain decreases, and conversely, in the event of an undershoot, the delay increases. Various thresholds can be set by using additional matched delay elements, which are insensitive to Vdd variations. These additional programmable delay elements are placed between the outputs of the delay chains and the inputs of the phase detectors. The thresholds are set by choosing delay elements proportional to the voltage thresholds.

Advantageously, this capability does not require a dedicated on-chip quiet Vdd for comparison with the noisy Vdd supply. This makes this capability more practical and feasible than the current approaches. Also, the programmability for setting the various thresholds is done by using delay elements which is extremely area efficient. This capability also has extreme flexibility in terms of allowing the detection of noise of a particular frequency by using delay chains of different lengths. Hence, this capability delivers both threshold and frequency programmability.

In designing the on-chip sensor, various design assumptions are made. In one example, these assumptions include the following:

1. Noise has a zero mean. The average noise is to equal zero +/– or else there is a D.C. shift in power supply voltage.
2. If the period of the noise is approximately the same as the total delay in the delay chains, it will be averaged or integrated out. This is analyzed and characterized.
3. If the period of the noise is much greater than the delay in the delay chains, it is detected.
4. The pulse width of the input to the delay chains is to be at least 2× the phase error generated by the noise between the two delay chains. Otherwise, the phase detector output is ambiguous. An error signal is generated, if this condition is violated. However, as the period of the input of delay chains decreases, the sampling rate of the sensor increases. Hence, the input should have as high a frequency as possible to safely operate and accommodate the maximum expected phase error caused by noise.
5. The voltage insensitive delay chain includes a feedback loop that compensates for a noisy supply. The loop bandwidth is to be greater than the noise period. Otherwise, the noise is not detected. This feedback loop is included, for instance, in the reference current generator, which is used to provide a constant current.

In this example, the two delay chains are calibrated either manually, by script or with an on-chip state machine, as examples, in the following manner:

a) The delay control setting CNTRL-1 of the Vdd insensitive delay line is set to a desired value, and the sensitive delay control setting (CNTRL-2) is set to a smaller value as to ensure the phase detector has a predetermined output, i.e., the undershoot phase detector outputs a logic level zero, and the overshoot phase detector outputs a logic one indicating the delay of the insensitive delay line is longer. Both delay elements in front of the phase detectors (CNTRL-3, CNTRL-4) are set to a minimum value. Note the phase detectors are balanced with the addition of mimic delay elements.

b) The delay of the sensitive delay chain (CNTRL-2) is increased one delay step at a time until the phase detector indicates a change in phase—output goes from a logic zero to a logic one or vise versa. This is done with a quiet Vdd, as one example. At this point, the two delay chain outputs should be within one delay step of equal delay.

Operationally, if there is an overshoot in the power supply, the sensitive delay chain decreases in delay with a larger perturbation than the voltage insensitive delay line. This causes the signal output of the voltage sensitive delay line to arrive at the phase detector inputs earlier in time relative to the other delay chain, causing a logic level zero on the undershoot phase detector and a logic one of the overshoot phase detector output. The opposite is true for an undershoot on the power supply.

To program a threshold, CNTRL-3 and CNTRL-4 are preset to the desired overshoot/undershoot detection value. For example, if a 50 pS phase error between the two delay chains is reached when there is a 10% change in supply, then CNTRL-3 and 4 are set to a value of 50 pS, i.e. 5 steps. The outputs of both phase detectors should now be a logic level zero. If the power supply overshoots by 10% or more, the delay in the voltage sensitive delay line decreases causing the overshoot phase detector output to change from a logic zero to a logic one. If the input pulse has sufficient pulse width (at least 2× the phase error), the undershoot phase detector remains at a logic level zero. If the power supply dipped by 10% or more, the delay in the voltage sensitive delay chain increases causing the undershoot phase detector output to change from a logic zero to a logic one. The output of the phase detector can also be attached to a counter to get a further understanding of how often the noise jumps above the threshold set by CNTRL-3 and CNTRL-4, or it may be connected to a 'sticky' latch where one would only be interested, if the noise ever grew to that level.

Note the value of each step is assumed to be known using a delay chain calibration circuit operating in parallel. This delay chain may include sensitive or insensitive delay elements or a combination thereof. The calibration circuit measures how many delay steps are in a clock period. Hence if the clock period is known, the magnitude of a delay step can be calculated.

To set the Vdd sensor noise frequency cut off, the length of the delay chain (CNTRL-1 & CNTRL-2) is programmable. As a general rule, if the noise period is 2× larger than the length of the delay chain, the Vdd sensor detects the noise. If the noise period is less than the length of the delay chain, it is averaged, and therefore, not detected. Hence, the frequency characteristic of the noise can be characterized by presetting the delay chain length. Note the input signal is to be proportional to the amount of noise to be detected. The input rate should be as fast as possible to maximize the sampling rate, but the pulse width is to be at least 2× the maximum amount of phase error between the two delay chains in a noisy environment. If the phase error between the two delay chains exceeds the input pulse width, both the overshoot and undershoot signals change to logic 1, causing the error signal to go high.

Figure 7:
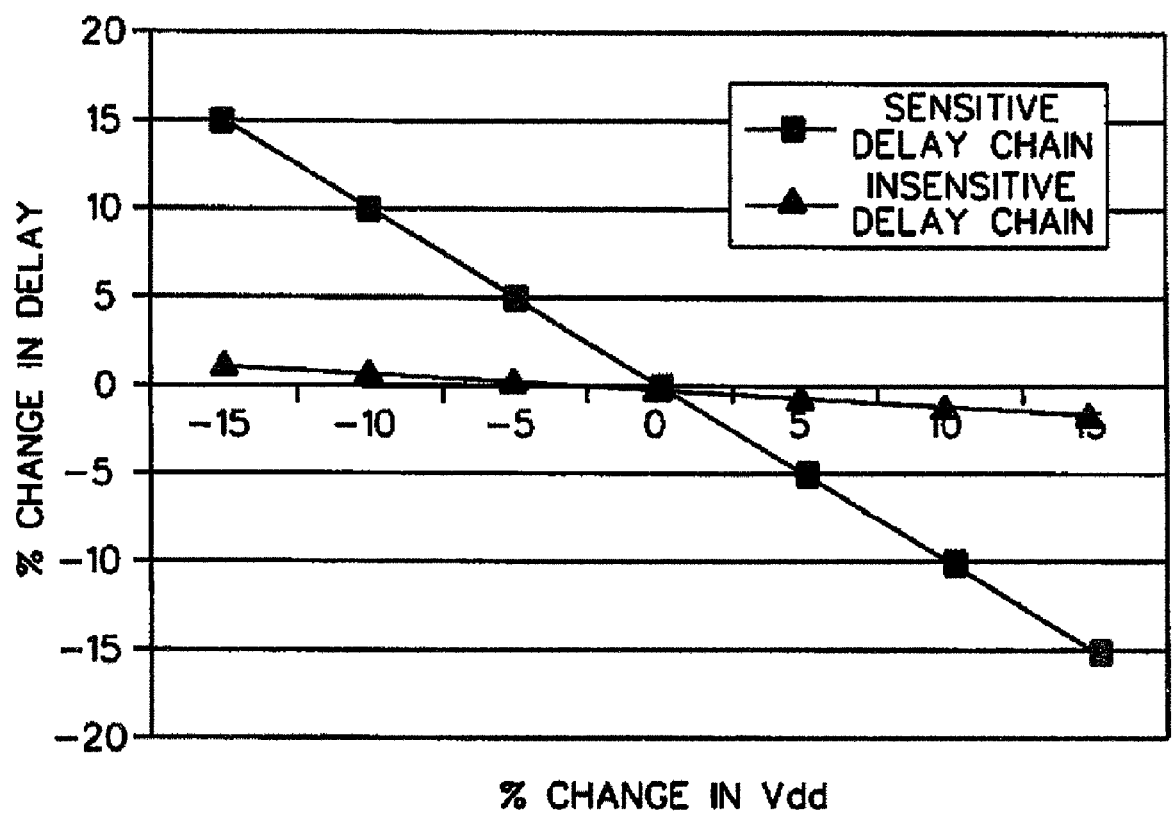
FIG. 7 illustrates the relationship between the delay of the insensitive delay chain and the sensitive delay chain of FIG. 1 with a variation in supply voltage, in accordance with an aspect of the present invention.

One example of the relationship between the delay of the delay chains with variation in supply voltage is illustrated in FIG. 7. As depicted, as the supply voltage varies from −15% to 15% of its nominal value, the two delay chains show a steady variation in their delay from their delay at nominal voltage. The sensitive delay chain shows a change of about 1% for every percent change in supply voltage above or below a nominal value (e.g., 1.2V). The insensitive delay chain varies about 0.1% for every 1% change in Vdd above or below the nominal value.

Described above is an on-chip sensor that is simple and flexible in that it can be controlled. The sensor can be placed in many locations on a chip to monitor various voltage supplies. Such chips can be used in many electronic devices, such as computers or other devices.

In one example, the on-chip sensor includes two delay chains: one referred to as a sensitive delay chain and the other referred to as an insensitive delay chain. The insensitive delay chain, as used herein, is a delay chain that is less sensitive than the sensitive delay chain. That is, the delay chains have different power supply sensitivities. Signals which have propagated down the two different paths having different power supply sensitivities are compared.

As one particular example, the insensitive delay chain is capable of providing delay that is insensitive to voltage fluctuation (i.e., noise, voltage sensitivity etc.). That is, typically, in a sensitive delay chain, the delay changes proportional to voltage fluctuation, e.g., a 10% change in voltage yields a 10% change in delay. However, with the insensitive delay chain, the delay is insensitive to voltage fluctuation in that a change in voltage fluctuation causes a less than proportional change in delay (e.g., a 10% change in voltage fluctuation yields less than a 10% change in delay). As one example, the delay is provided by delay elements capable of producing constant delay regardless of power supply variation. That is, there is little or no variation in the delay (e.g., approximately +/−1% of variation). In other embodiments, however, the change in delay is greater, but still less than proportional to the change in voltage fluctuation. As examples, the change in delay may be +/−2%, 3% or other percents. These are all considered within the spirit of one or more aspects of the present invention.

Although examples are provided above, these are only examples. Many variations may be made without departing from the spirit of one or more aspects of the present invention. For instance, different types of transistors may be used in one or more of the structures or circuits, more or less transistors may be used in one or more of the structures or circuits, etc. Further, structures or logic circuits other than inverter structures may be used as or in the delay elements. Many other variations are also possible.

Although various assumptions and design considerations are provided above, these are only examples. Other or different assumptions and/or design considerations may be provided or included without departing from the spirit of one or more aspects of the present invention. Moreover, calibration may be performed in many ways.

The programmability of one or more of the delay chains is optional. More or less programmability may be provided.

The diagrams depicted herein are just examples. There may be many variations to these diagrams without departing from the spirit of the invention. For instance, other types of transistors may be used. Additionally, more or less transistors may be used. All of these variations are considered a part of the claimed invention.

One or more aspects of the present invention may be performed in software, hardware or a combination thereof.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A sensing circuit comprising:
an on-chip sensor to detect vulnerability in a power supply of a chip comprising the on-chip sensor, said on-chip sensor detecting the vulnerability absent components external to the chip, wherein the on-chip sensor comprises a sensitive delay chain sensitive to variations in voltage of the power supply and an insensitive delay chain insensitive to variations in voltage of the power supply, the sensitive delay chain and the insensitive delay chain employed to detect the vulnerability, and wherein an output of the insensitive delay chain is a delayed signal that is coupled to an input of a first phase detector and an input of a second phase detector, and an output of the sensitive delay chain is a delayed signal that is coupled to an input of the first phase detector and an input of the second phase detector, and wherein the first phase detector and the second phase detector are used to compare the difference in phase between the delayed signals from the sensitive delay chain and the insensitive delay chain to detect vulnerability; and
wherein the circuit comprises a plurality of delay chains coupled to the output of insensitive delay chain and the output of sensitive delay chain and coupled to one or more inputs of the first phase detector and one or more inputs of the second phase detector to further delay the delayed signals from the insensitive delay chain and the sensitive delay chain.

2. The circuit of claim 1, wherein the vulnerability is detected by comparing a difference in phase between a propagation delay of the insensitive delay chain and a propagation delay of the sensitive delay chain.

3. The circuit of claim 1, wherein at least one delay chain of the plurality of delay chains is programmable to enable a vulnerability to be detected that is based on a user-defined threshold.

4. The circuit of claim 1, wherein at least one of the insensitive delay chain and the sensitive delay chain is programmable to control an amount of delay through the delay chain.

5. The circuit of claim 1, wherein the insensitive delay chain comprises a plurality of insensitive delay elements.

6. The circuit of claim 1, wherein the sensitive delay element comprises a plurality of sensitive delay elements.

7. The circuit of claim 1, wherein the vulnerability comprises one of an overshoot or an undershoot of the voltage of the power supply.

8. The circuit of claim 1, wherein the on-chip sensor comprises one delay chain and another delay chain employed to detect the vulnerability, the one delay chain and the another delay chain having different power supply sensitivities.

9. A chip comprising:
an on-chip sensor to detect vulnerability in a power supply of the chip, the on-chip sensor comprising:
a sensitive delay chain sensitive to variations in voltage of the power supply; and
an insensitive delay chain insensitive to variations in voltage of the power supply, the sensitive delay chain and the insensitive delay chain being used to detect the vulnerability, wherein an output of the insensitive delay chain is a delayed signal that is coupled to an input of a first phase detector and an input of a second phase detector, and an output of the sensitive delay chain is a delayed signal that is coupled to an input of the first phase detector and an input of the second phase detector, and wherein the first phase detector and the second phase detector are used to compare the difference in phase between the delayed signals from the sensitive delay chain and the insensitive delay chain to detect vulnerability; and wherein the chip comprises a plurality of delay chains coupled to the output of insensitive delay chain and the output of sensitive delay chain and coupled to one or more inputs of the first phase detector and one or more inputs of the second phase detector to further delay the delayed signals from the insensitive delay chain and the sensitive delay chain.

10. The chip of claim 9, wherein the vulnerability is detected by comparing a difference in phase between a propagation delay of the insensitive delay chain and a propagation delay of the sensitive delay chain.

11. The chip of claim 9, further comprising a plurality of on-chip sensors to detect vulnerabilities in a plurality of power supplies of the chip.

* * * * *